United States Patent
Kim et al.

(10) Patent No.: US 11,365,350 B2
(45) Date of Patent: Jun. 21, 2022

(54) SILANE COMPOUND

(71) Applicants: SK Innovation Co., Ltd., Seoul (KR); SK INC., Seoul (KR)

(72) Inventors: Cheol Woo Kim, Daejeon (KR); Yu Na Shim, Daejeon (KR); Kwang Kuk Lee, Daejeon (KR); Young Bom Kim, Yeongju-si (KR); Jin Kyung Jo, Yeongju-si (KR)

(73) Assignees: SK Innovation Co., Ltd., Seoul (KR); SK INC., Seoul (KR)

( * ) Notice: Subject to any disclaimer, the term of this patent is extended or adjusted under 35 U.S.C. 154(b) by 40 days.

(21) Appl. No.: 16/995,916

(22) Filed: Aug. 18, 2020

(65) Prior Publication Data

US 2020/0377794 A1 Dec. 3, 2020

Related U.S. Application Data

(62) Division of application No. 16/422,098, filed on May 24, 2019, now Pat. No. 10,836,962.

(30) Foreign Application Priority Data

May 26, 2018 (KR) .................. 10-2018-0060001
Oct. 24, 2018 (KR) .................. 10-2018-0127497

(51) Int. Cl.
*C09K 13/06* (2006.01)
*H01L 21/311* (2006.01)
*C07F 7/02* (2006.01)
*C07F 7/18* (2006.01)

(52) U.S. Cl.
CPC .............. *C09K 13/06* (2013.01); *C07F 7/025* (2013.01); *C07F 7/1804* (2013.01); *H01L 21/31111* (2013.01)

(58) Field of Classification Search
CPC ......... C09K 13/06; C07F 7/025; C07F 7/1804
See application file for complete search history.

(56) References Cited

U.S. PATENT DOCUMENTS

| 8,252,863 | B2 * | 8/2012 | Hasse | C08K 5/548 524/262 |
|---|---|---|---|---|
| 2009/0081927 | A1 | 3/2009 | Grumbine et al. | |
| 2009/0221751 | A1 | 9/2009 | Hasse et al. | |
| 2013/0092872 | A1 | 4/2013 | Hong et al. | |
| 2013/0157427 | A1 | 6/2013 | Cho et al. | |
| 2013/0313225 | A1 | 11/2013 | Jin et al. | |

FOREIGN PATENT DOCUMENTS

| CN | 103160282 A | 6/2013 |
|---|---|---|
| JP | 2000-345036 A | 12/2000 |
| JP | 2009-524715 | 7/2009 |
| KR | 10-2017-0066180 | 6/2017 |
| KR | 10-1743101 B1 | 6/2017 |
| KR | 10-1828437 B1 | 3/2018 |
| WO | WO 2017/085022 A1 | 6/2017 |

OTHER PUBLICATIONS

Frye (Journal of the American Chemical Society; 1971, 93(25) 605-11).*
Combined Chinese Office Action and Search Report dated Aug. 30, 2021 in Chinese Patent Application No. 201910422918.8 (with partial English translation), 8 pages.
Lu Kaijuan, et al. "Synthesis of Bis-silatranes" Chemistry Bulleting, No. 7, Jul. 30, 1989, pp. 31-33.
J. K. Puri, et al., "Silatranes: a review on their synthesis, structure, reactivity and applications", Chem. Soc. Rev., 2011, 40, pp. 1791-1840.
N.F. Lazareva, et al., "The Reaction of N-methy-N, N-bis-(silatranylmethyl)amine with dichloromethane", Russian Chemical Bulletin, International Edition, vol. 57, No. 10, Oct. 2008, pp. 2235-2236.
Shailesh C. Verma et al., "Synthesis and characterization of new 1-organylsilatranes", Indian Journal of Chemistry, vol. 41B, Mar. 2002, pp. 608-613.
Office Action dated Jul. 31, 2019 in corresponding Korean Patent Application No. 10-2018-0127497, 2 pages.

* cited by examiner

*Primary Examiner* — Pancham Bakshi
(74) *Attorney, Agent, or Firm* — Oblon, McClelland, Maier & Neustadt, L.L.P.

(57) ABSTRACT

An etchant composition includes a silane compound represented by the following Chemical Formula 1:

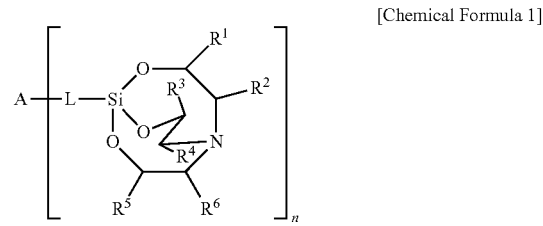

[Chemical Formula 1]

wherein $R^1$ to $R^6$ are independently hydrogen, halogen, a substituted or unsubstituted $C_1$-$C_{20}$ hydrocarbyl group, a phenyl group, a $C_1$-$C_{20}$ alkoxy group, a carboxy group, a carbonyl group, a nitro group, a tri ($C_1$-$C_{20}$) alkylsilyl group, a phosphoryl group, or a cyano group, L is a direct bond or $C_1$-$C_3$ hydrocarbylene, A is an n-valent radical, and n is an integer of 1 to 4.

2 Claims, 1 Drawing Sheet

SILANE COMPOUND

CROSS-REFERENCE TO RELATED APPLICATION(S)

This application is a divisional of U.S. application Ser. No. 16/422,098, filed on May 24, 2019, and claims benefit of priority to Korean Patent Application No. 10-2018-0060001 filed on May 26, 2018 and 10-2018-0127497 filed on Oct. 24, 2018 in the Korean Intellectual Property Office, the disclosure of which is incorporated herein by reference in its entirety.

BACKGROUND

1. Field

The present disclosure relates to an etchant composition, and more particularly, to an etchant composition having a high selection ratio which may selectively remove a nitride film while minimizing an etching rate of an oxide film, a method of etching an insulating film, and a method of manufacturing a semiconductor device. In addition, the present disclosure relates a silane compound which is appropriate for use as an additive of the etchant composition.

2. Description of Related Art

An oxide film such as a silicon oxide ($SiO_2$) film and a nitride film such as a silicon nitride (SiNx) film are representative insulator films, and in a semiconductor manufacturing process, the silicon oxide film or the silicon nitride film is used alone or in the form of a laminate in which one or more films are alternately stacked. In addition, the oxide film or the nitride film is also used as a hard mask for forming a conductive pattern such as a metal wiring.

In a wet etching process for removing the nitride film, a mixture of phosphoric acid and deionized water is generally used. The deionized water is added for preventing a decrease in an etching rate and a change in etching selectivity to an oxide film; however, there is a problem in that defects arise in a nitride film etching removal process even with a minute change in an amount of supplied deionized water. In addition, phosphoric acid is a strong acid and corrosive, thereby having a difficulty in handling.

In order to solve the problem, there is a conventionally known technology for removing a nitride film using an etchant composition including fluoric acid (HF), nitric acid ($HNO_3$), or the like in phosphoric acid ($H_3PO_4$), but causing a result of inhibiting an etching selection ratio of the nitride film and the oxide film. In addition, there is also known a technology of using an etchant composition including phosphoric acid and a silicate or silicic acid; however, the silicic acid or silicate has a problem of causing particles which may affect a substrate, thereby being somewhat inappropriate for a semiconductor manufacturing process.

Meanwhile, when phosphoric acid is used in a wet etching process for removing the nitride film, not only the nitride film but also an SOD oxide film is etched due to a reduced etching selection ratio between the nitride film and the oxide film, whereby it is difficult to adjust an effective field oxide height (EFH). Accordingly, a sufficient wet etching time for removing the nitride film may not be secured, or an additional process is needed, which causes a change and has a bad influence on device characteristics.

Therefore, an etchant composition having a high selection ratio, which selectively etches a nitride film to an oxide film and does not have a problem such as particle occurrence in a semiconductor manufacturing process, is currently demanded.

SUMMARY

An aspect of the present disclosure may provide an etchant composition having a high selection ratio, which may selectively remove a nitride film while minimizing an etching rate of an oxide film, and does not have problems such as particle occurrence having a bad influence on device characteristics, and a silane compound used in the etchant composition.

According to an aspect of the present disclosure, an etchant composition may include phosphoric acid and a silane compound represented by the following Chemical Formula 1:

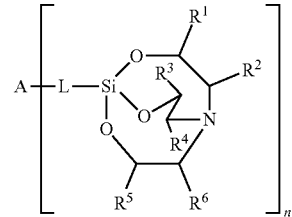

[Chemical Formula 1]

wherein $R^1$ to $R^6$ are independently hydrogen, halogen, a substituted or unsubstituted $C_1$-$C_{20}$ hydrocarbyl group, a $C_1$-$C_{20}$ alkoxy group, a carboxy group, a carbonyl group, a nitro group, a tri($C_1$-$C_{20}$) alkylsilyl group, a phosphoryl group, or a cyano group, L is a direct bond or $C_1$-$C_3$ hydrocarbylene, A is an n-valent radical, and n is an integer of 1 to 4.

According to an exemplary embodiment, the substituted or unsubstituted $C_1$-$C_{20}$ hydrocarbyl group is a substituted or unsubstituted $C_1$-$C_{20}$ alkyl group or a substituted or unsubstituted $C_6$-$C_{20}$ aryl group, and the substituted $C_1$-$C_{20}$ hydrocarbyl group may be substituted by halogen.

According to an exemplary embodiment, the etchant composition wherein A is $C_1$-$C_{20}$ alkyl, $C_2$-$C_{20}$ alkenyl, $C_6$-$C_{20}$ aryl, a radical having N as a binding site, a radical having S as a binding site, or a radical having P as a binding site, is provided.

According to an exemplary embodiment, the etchant composition wherein the radical having N as a binding site is *—$NR^{11}R^{12}$, *—$NR^{13}$—*, *—$NR^{14}CONR^{15}$—*, *—$NR^{16}CSNR^{17}$—*, or

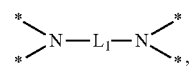

is provided, wherein $R^{11}$ and $R^{12}$ are independently hydrogen, $C_1$-$C_{20}$ alkyl, $C_1$-$C_{20}$ aminoalkyl, or $CONH_2$, $R^{13}$ to $R^{17}$ are independently hydrogen or $C_1$-$C_{20}$ alkyl, and $L_1$ is $C_1$-$C_{20}$ alkylene.

According to an exemplary embodiment, the etchant composition wherein the radical having S as a binding site is *—S—*, *—S—S—*,

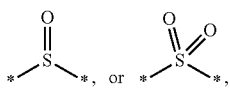, or is provided.

According to an exemplary embodiment, the etchant composition wherein the radical having P as a binding site is

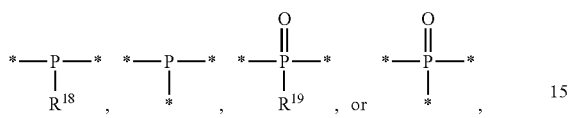

is provided, wherein $R^{18}$ and $R^{19}$ are independently hydrogen, $C_1$-$C_{20}$ alkyl, $C_6$-$C_{20}$ aryl, or $(C_1$-$C_{20})$alkyl$(C_1$-$C_{20})$alkoxy.

According to an exemplary embodiment, the etchant composition wherein in Chemical Formula 1, n is 1, L is a direct bond or $C_1$-$C_3$ alkylene, A is a substituted or unsubstituted $C_1$-$C_{20}$ alkyl, a substituted or unsubstituted $C_1$-$C_{20}$ alkenyl, *—$NH_2$, *—NH—$(CH_2)_l$—$NH_2$, *—NH—CO—$NH_2$, or *—$(CH_2)_m$—$C_6H_5$, and l and m is independently an integer of 0 to 10, is provided.

According to an exemplary embodiment, the etchant composition wherein in Chemical Formula 1, n is 2, L is a direct bond or $C_1$-$C_3$ alkylene, A is $C_1$-$C_{20}$ alkylene, *—$NR^{13}$—*, *—$NR^{14}$—CO—$NR^{15}$—*, *—S—*, *—S—S—*,

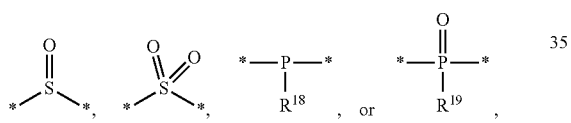

$R^{13}$ to $R^{15}$, $R^{18}$, and $R^{19}$ are independently hydrogen, $C_1$-$C_{20}$ alkyl, $C_6$-$C_{20}$ aryl, or $(C_1$-$C_{20})$alkyl$(C_1$-$C_{20})$alkoxy, is provided.

According to an exemplary embodiment, the etchant composition wherein in Chemical Formula 1, n is 3, L is a direct bond or $C_1$-$C_3$ alkylene and A is

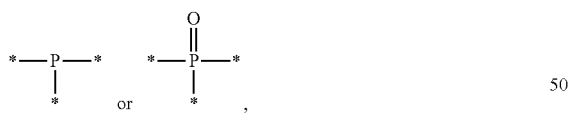

is provided.

According to an exemplary embodiment, the etchant composition wherein in Chemical Formula 1, n is 4, is $C_1$-$C_3$ alkylene, A is

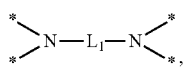

wherein $L_1$ is $C_1$-$C_{10}$ alkylene, is provided.

According an exemplary embodiment, the etchant composition wherein the silane compound is selected from compounds represented by Structural Formulae (1) to (28), is provided:

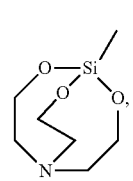 (1)

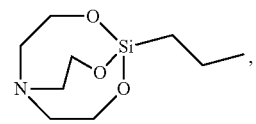 (2)

 (3)

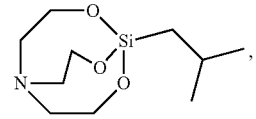 (4)

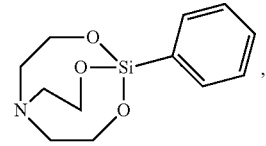 (5)

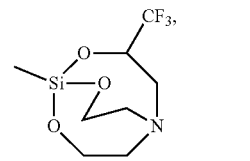 (6)

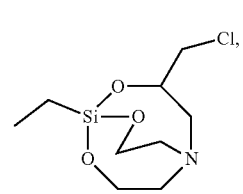 (7)

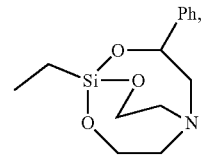 (8)

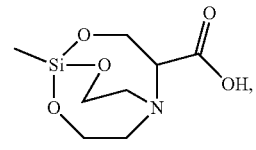 (9)

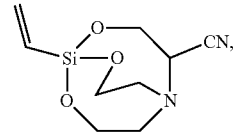 (10)

(11) 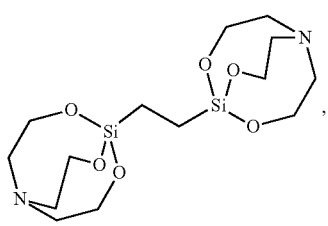
(12) 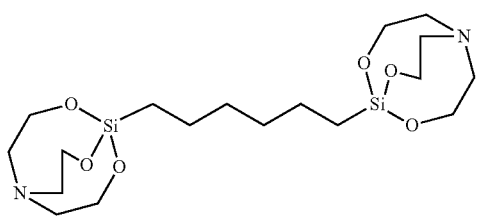
(13) 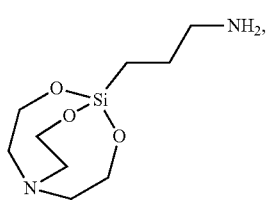
(14) 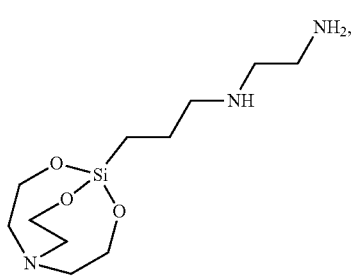
(15) 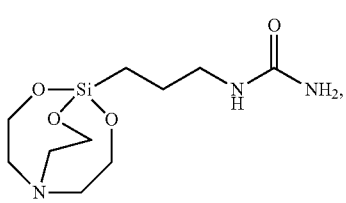
(16) 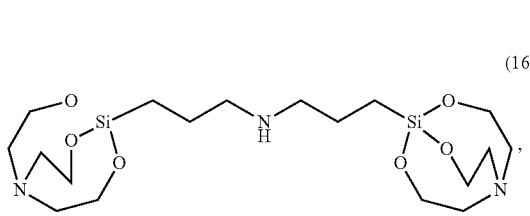
(17) 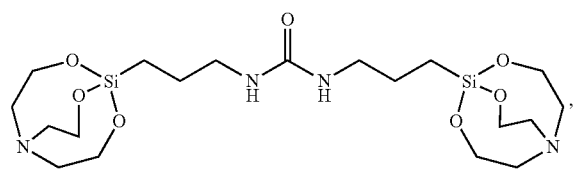
(18) 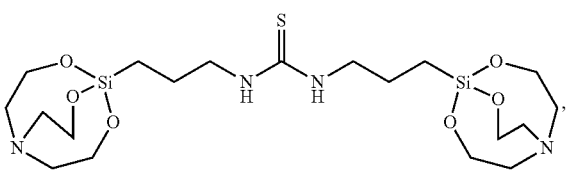
(19) 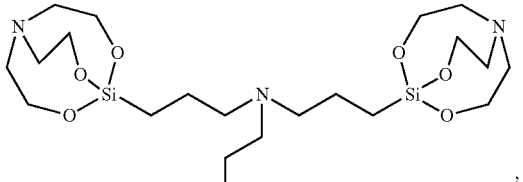
(20) 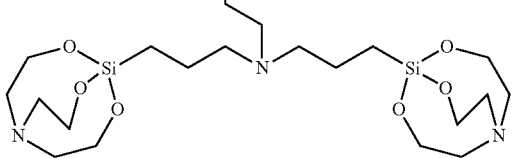
(21) 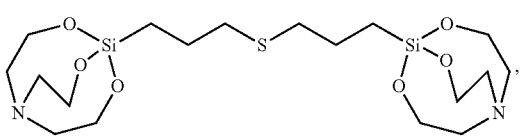
(22) 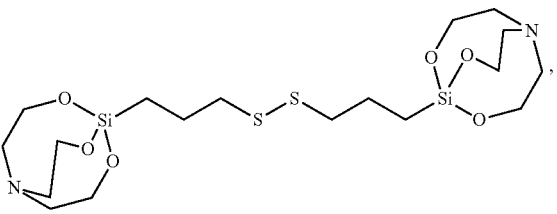
(23) 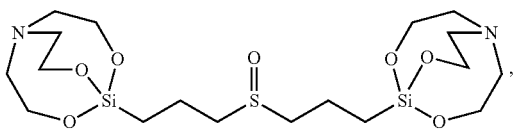
(24) 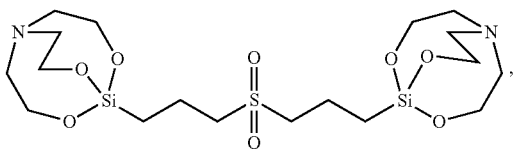
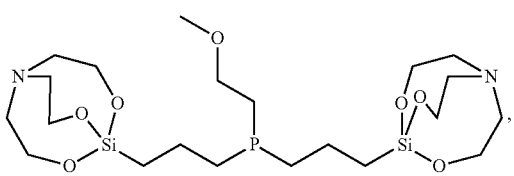

-continued

(25)
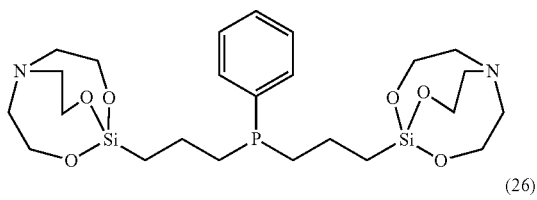

(26)
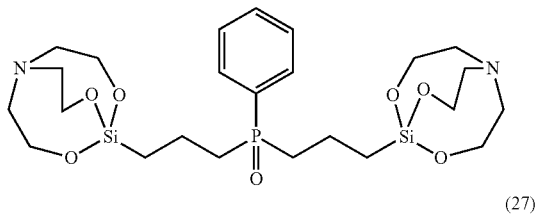

(27)
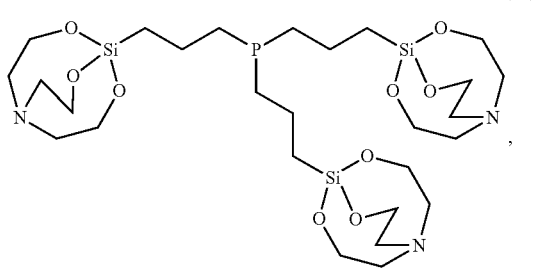

(28)
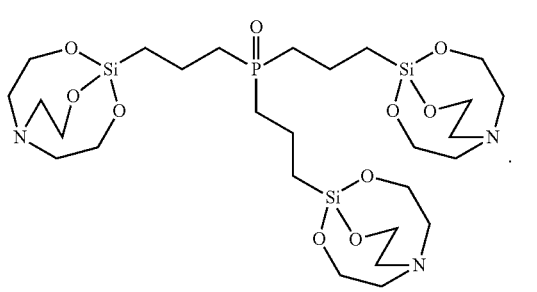

According to an exemplary embodiment, the etchant composition wherein the silane compound is included in an amount of 0.001 to 1 wt %, based on the total weight of the etchant composition, is provided.

According to an exemplary embodiment, the etchant composition further including a silane compound represented by the following Chemical Formula 2, is provided.

According to an exemplary embodiment, it is preferable that in Chemical Formula 1, $R^1$ to $R^6$ are hydrogen, and also $R^1$ is a substituted or unsubstituted hydrocarbyl, and $R^2$ to $R^6$ are hydrogen.

[Chemical Formula 2]

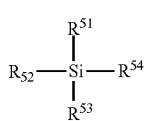

wherein $R^{51}$ to $R^{54}$ are independently of each other hydrogen, hydrocarbyl, or heterohydrocarbyl, in which $R^{51}$ to $R^{54}$ exist respectively or two or more of $R^{51}$ to $R^{54}$ form a ring connected to each other by a heteroelement.

According to an exemplary embodiment, the etchant composition further including an ammonium salt is provided.

According to another aspect of the present disclosure, a method of etching an insulating film using the etchant composition is provided.

According to another aspect of the present disclosure, a method of manufacturing a semiconductor device may include the method of etching an insulating film.

According to another aspect of the present disclosure, a silane compound represented by the following Chemical Formula 1, which is appropriate for addition to the etchant composition, is provided.

According to another aspect of the present disclosure, a silane compound represented by the following Chemical Formula 1 is provided:

[Chemical Formula 1]

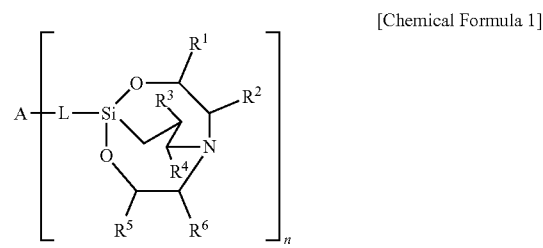

wherein $R^1$ to $R^6$ are independently hydrogen, halogen, a substituted or unsubstituted $C_1$-$C_{20}$ hydrocarbyl group, a $C_1$-$C_{20}$ alkoxy group, a carboxy group, a carbonyl group, a nitro group, a tri($C_1$-$C_{20}$)alkylsilyl group, a phosphoryl group, or a cyano group, L is a direct bond or $C_1$-$C_3$ alkylene, n is 4, A is

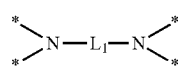

as a tetravalent radical, and $L_1$ is $C_1$-$C_{10}$ alkylene.

According to an exemplary embodiment, the silane compound wherein Chemical Formula 1 is represented by the following structure, is provided:

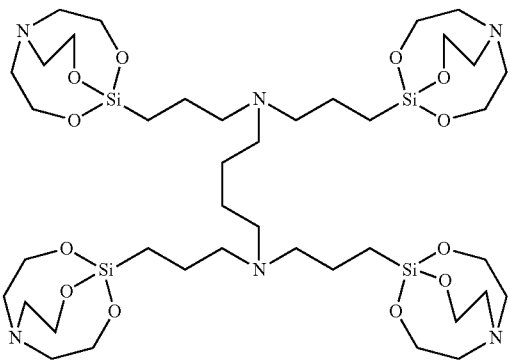

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
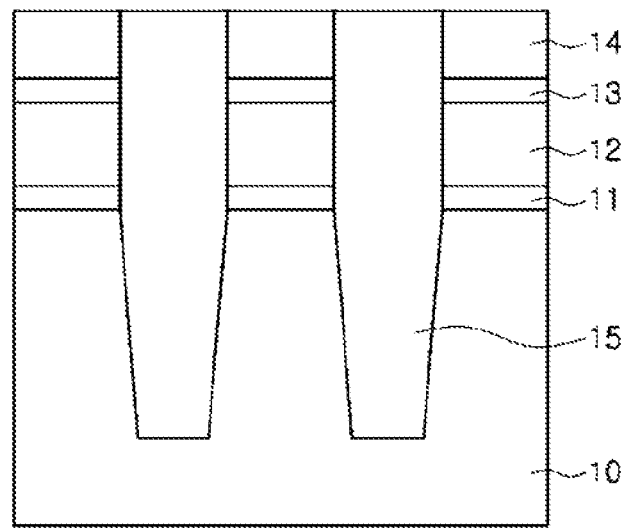
FIGS. 1 and 2 are process sectional views showing a device separation process of a flash memory device.

Hereinafter, exemplary embodiments in the present disclosure will now be described in detail with reference to the accompanying drawings.

Since the present disclosure may be variously modified and have several exemplary embodiments, specific exemplary embodiments will be shown in the embodiment and be described in detail in the detailed description. However, it is to be understood that the present disclosure is not limited to a specific exemplary embodiment, but includes all modifications, equivalents, and substitutions without departing from the scope and spirit of the present disclosure.

Terms used in the present disclosure are used only in order to describe specific exemplary embodiments rather than limiting the present disclosure. Singular forms are intended to include plural forms unless otherwise indicated contextually. It will be further understood that the terms "comprises" or "have" used in this specification, specify the presence of stated features, steps, operations, components, parts, or a combination thereof, but do not preclude the presence or addition of one or more other features, numerals, steps, operations, components, parts, or a combination thereof.

An etchant composition according to an exemplary embodiment of the present disclosure includes phosphoric acid and a silane compound.

The phosphoric acid may be reacted with silicon nitride to etch the nitride. The silicon nitride and the phosphoric acid may be reacted and etched as shown in the following Formula (1):

$$3Si_3N_4 + 27H_2O + 4H_3PO_4 \rightarrow 4(NH_4)_3PO_4 + 9SiO_2H_2O \quad (1)$$

The phosphoric acid may be, far example, an aqueous phosphoric acid solution containing phosphoric acid at a concentration or 80%, but not limited thereto, water to be used in the aqueous phosphoric acid solution is not particularly limited, but is preferably deionized water.

The silane compound may be represented by the following Chemical Formula 1:

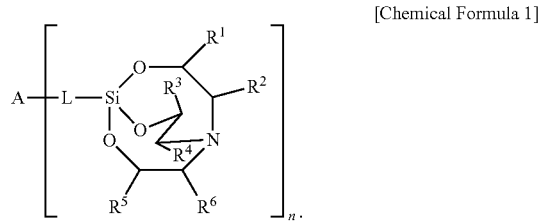

[Chemical Formula 1]

In Chemical Formula 1, $R^1$ to $R^6$ may be independently hydrogen, halogen, a substituted or unsubstituted $C_1$-$C_{20}$ hydrocarbyl group, a $C_1$-$C_{20}$ alkoxy group, a carboxy group, a carbonyl group, a nitro group, a tri($C_1$-$C_{20}$)alkylsilyl group, a phosphoryl group, or a cyano group. More preferably, in Chemical Formula 1, $R^1$ to $R^6$ may be hydrogen, and also $R^1$ may be a substituted or unsubstituted $C_1$-$C_{20}$ hydrocarbyl, and $R^2$ to $R^6$ may be hydrogen.

The substituted or unsubstituted $C_1$-$C_{20}$ hydrocarbyl group may be a substituted or unsubstituted $C_1$-$C_{20}$ alkyl group or a substituted or unsubstituted $C_6$-$C_{20}$ aryl group, wherein the substituted hydrocarbyl group may be a hydrocarbyl group substituted by halogen such as alkyl halide.

L may be a direct bond or $C_1$-$C_3$ hydrocarbylene, more specifically $C_1$-$C_3$ alkylene.

A represents an n-valent radical wherein n is an integer of 1 to 4. For example, A may be hydrocarbyl, hydrocarbylene, a radical having N as a binding site, a radical having S as a binding site, a radical having P as a binding site, or the like.

For example, the hydrocarbyl may be substituted or unsubstituted $C_1$-$C_{20}$ alkyl, $C_2$-$C_{20}$ alkenyl, or $C_6$-$C_{20}$ aryl, and more specifically, for example, —$CH_3$, —$(CH_2)_3$, —$(CH_2)_2CH_3$, —$(CH_2)_7CH_3$, —$CH_2CH(CH_3)_2$, $CHCH_2$, phenyl, or the like. Herein, n is an integer of 1. Furthermore, when n is 2, the hydrocarbylene may be $C_2$-$C_{20}$ alkylene such as $(CH_2)_2$.

In the case of the radical having N as a binding site, for example, when n is 1, A may be unsubstituted amine such as *—$NH_2$ or *—$NR_{11}R_{12}$, or for example, substituted amine such as *—$NH(CH_2)_2NH_2$ or $NHCONH_2$, or the like. In addition, when n is 2, A may be *—$NR_{13}$—* such as *—$NH$—*, *—$NR_{14}CONR_{15}$—* such as *—$NHCONH$—*, *—$NR_{16}CSNR_{17}$—* such as *—$NHCSNH$—*, or the like. Furthermore, when n is 4, A may be

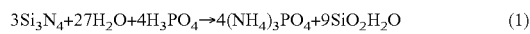

Herein, $R^{11}$ and $R^{12}$ may be independently hydrogen, $C_1$-$C_{20}$ alkyl, $C_1$-$C_{20}$ aminoalkyl, $CONH_2$, or the like, $R^{13}$ to $R^{17}$ may be independently hydrogen or $C_1$-$C_{20}$ alkyl, and $L_1$ may be $C_1$-$C_{20}$ alkylene.

The radical having S as a binding site may be for example, *—S—*, *—S—S—*,

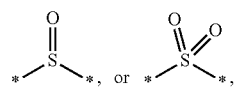

and in this case, n is an integer of 2.

Meanwhile, the radical having P as a binding site may be for example,

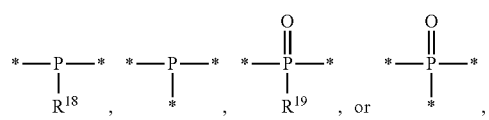

and in this case, n is an integer of 2 or 3, wherein $R^{18}$ and $R^{19}$ are independently hydrogen, $C_1$-$C_{20}$ alkyl, $C_6$-$C_{20}$ aryl, or $(C_1$-$C_{20})$alkyl$(C_1$-$C_{20})$alkoxy.

In the present disclosure, the silane compound of Chemical Formula 1, wherein n is 1 is, for example, the silane compound wherein L is a direct bond or $C_1$-$C_3$ alkylene, A is substituted or unsubstituted $C_1$-$C_{20}$ alkyl, *—$NH_2$, *—$NH$—$(CH_2)_1$—$NH_2$, *—$NH$—$CO$—$NH_2$, *—$C_6H_5$, or *—$(CH_2)_m$—$C_6H_5$, l and m independently an integer of 1 to 10.

In addition, the silane compound of Chemical Formula 1 wherein n is 2 may be the silane compound wherein L is a direct bond or $C_1$-$C_3$ alkylene, A is $C_1$-$C_{20}$ alkylene, *—$NH$—*, or *—$C(O)$—*.

Furthermore, the silane compound of Chemical Formula 1 wherein n is 4 may be the silane compound wherein A is
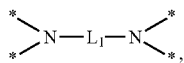
wherein $L_1$ is $C_1$-$C_{10}$ alkylene.
The silane compound represented by Chemical Formula 1 may be, more specifically for example, the silane compound represented by the following Structural Formula 1 to 28:
(1)
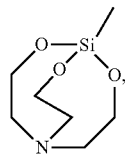
(2)
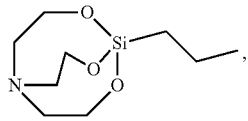
(3)
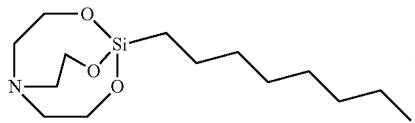
(4)
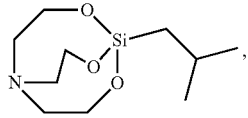
(5)
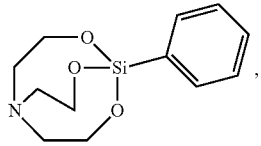
(6)
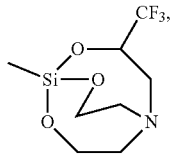
(7)
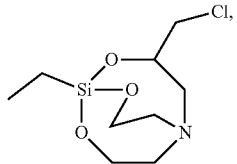
(8)
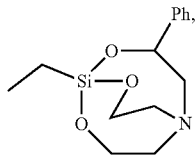
-continued
(9)
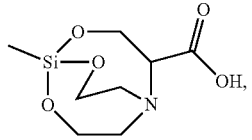
(10)
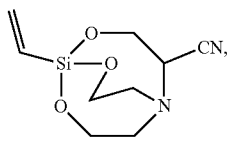
(11)
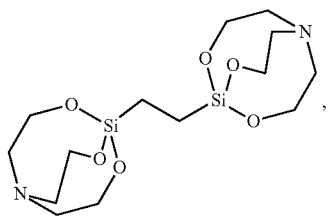
(12)
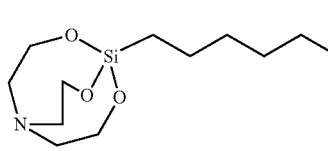
(13)
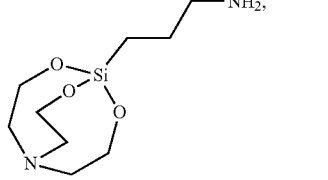
(14)
(15)
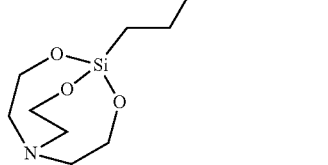
(16)
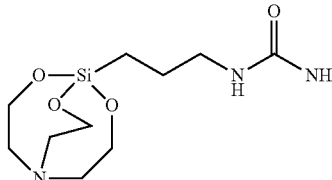

(17)
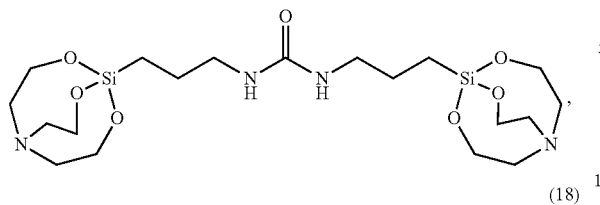

(18)
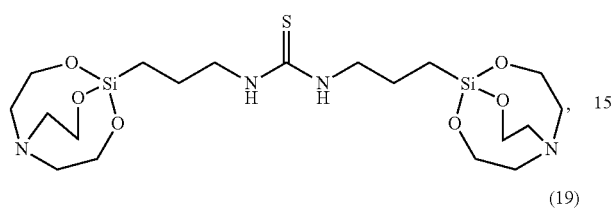

(19)
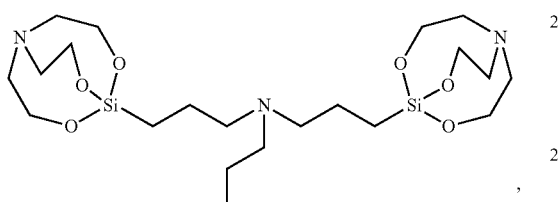

(20)
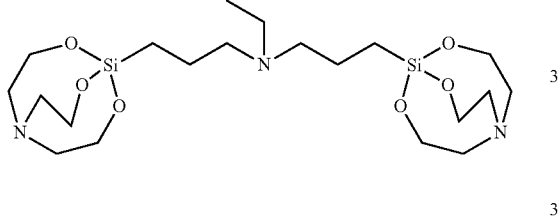

(21)
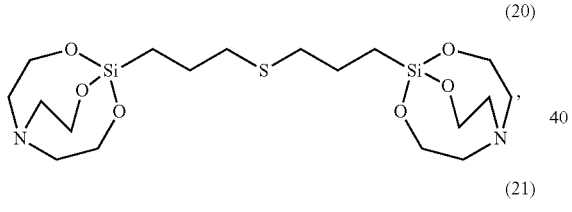

(22)
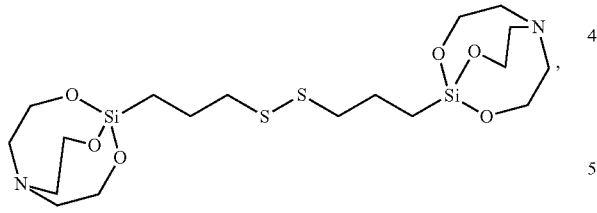

(23)
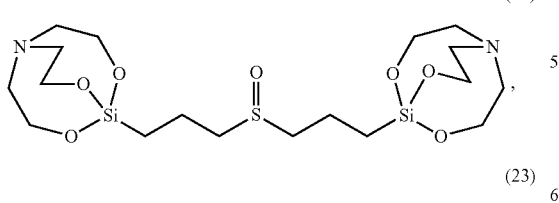

(24)
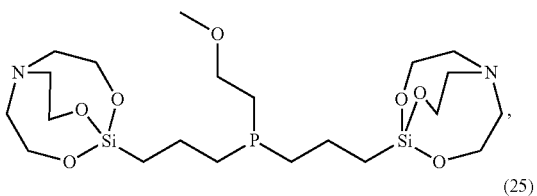

(25)
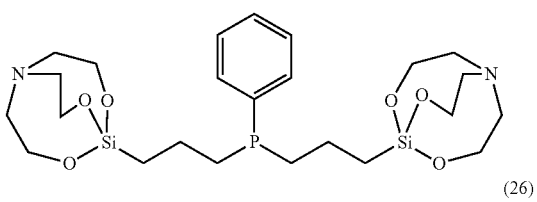

(26)
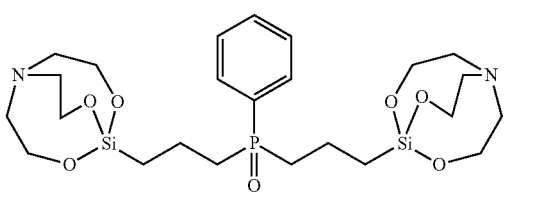

(27)
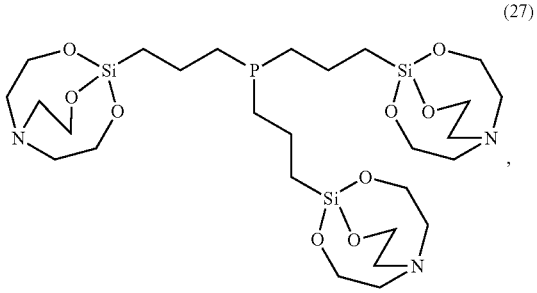

(28)
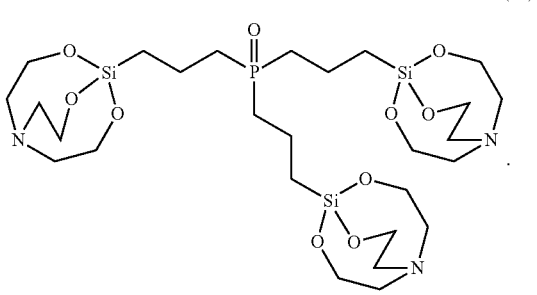

Oxygens included in the silane compound are bonded to the surface of the oxide film to protect the oxide film, and may be hydrogen-bonded to the surface of the oxide film, thereby minimizing etching of the oxide film during etching of a nitride in the etchant composition.

In addition, the silane compound described above is a cyclic silane compound and may be present in the most stable form in the etchant composition, and thus, may significantly increase an etch selection ratio as compared with a short chain silicon additive which has been commonly used. Furthermore, structural stability of the active silicon-based additive in the etchant composition is improved by including the cyclic compound as the above, thereby capable of consistently maintaining the etching speed of the silicon oxide film.

Meanwhile, in the above Formula 1, $SiO_2H_2O$ may be precipitated on the surface of the oxide film to increase a thickness of the oxide film. The phenomenon is referred to as abnormal growth. In particular, when the phenomenon proceeds by accumulation of the etching process of the nitride in the etchant composition, a concentration of $SiO_2H_2O$ in the etchant composition may be increased, and the increased concentration of $SSiO_2H_2O$ causes an increase in incidence of the abnormal growth That is, even in the case that the abnormal growth by $SiO_2H_2O$ does not occur in the initial etchant composition, the incidence of the abnormal growth increases with the increased number of accumulated processes. However, when the silane compound according to the present disclosure is included, occurrence of the abnormal growth phenomenon as such may be suppressed.

The silane compound of the present disclosure may be added in a content of 0.001 to 1 wt %, based on the total weight of the etchant composition. Since the silane compound used in the present disclosure has two or more silane groups as described above, the silane compound as suggested in the present disclosure may effectively protect a silicon oxide film even in the case of being added in a small amount to the etchant composition, thereby increasing etch selectivity of the nitride film to the oxide film. Specifically, when the use amount of the silane compound is less than 0.001 wt %, it is difficult to obtain an effect of high selectivity to the nitride film to the oxide film, and when the use amount is more than 1 wt %, the silane compound is gelled, which is not preferred. For example, the silane compound may be used at 0.001 to 1 wt %, 0.001 to 0.7 wt %, 0.002 to 0.7 wt %, 0.002 to 0.5 wt %, 0.005 to 0.5 wt %, or the like.

The etchant composition of the present disclosure may further include the silane compound represented by the following Chemical Formula 2:

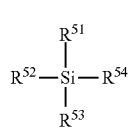

[Chemical Formula 2]

wherein $R^{51}$ to $R^{54}$ are independently of each other hydrogen, hydrocarbyl, or heterohydrocarbyl, in which $R^{51}$ to $R^{54}$ exist respectively or two or more of $R^{51}$ to $R^{54}$ form a ring connected to each other by a heteroelement. For example, $R^{51}$ to $R^{54}$ may be hydrogen, $C_1$-$C_{20}$ alkyl, $C_1$-$C_{20}$ heteroalkyl, or the like. Herein, the heteroelement is not particularly limited, but for example, may be N, S, O, P, or the like.

The silane compound represented by Chemical Formula 2 may be included in a content of 0.005 to 1 wt %, based on the total weight of the etchant composition.

Furthermore, ammonium salt may be added. The ammonium salt may prevent gelation of the etchant composition, and may be added in a content of 0.5 to 10 wt %, based on the total weight. When the ammonium salt is added at less than 0.5 wt %, a physical property improvement effect which decreases gelation is insignificant, and when added at more than 10 wt %, the ammonium salt may be the cause of gelation. For example, the ammonium salt may be added in a content of 0.5 to 7 wt %, 0.5 to 5 wt %, 0.5 to 3 wt %, 1 to 5 wt %, 1 to 3 wt %, or the like.

The ammonium salt is a compound having an ammonium ion, and those commonly used in the art to which the present disclosure pertains may be appropriately used in the present disclosure also. The ammonium salt may be, for example, ammonia water, ammonium chloride, ammonium acetate, ammonium phosphate, ammonium peroxydisulfate, ammonium sulfate, ammonium fluorate, or the like, but not limited thereto, and these may be used alone or combination of two or more.

Furthermore, the etchant composition of the present disclosure may further include an optional additive commonly used in the art, for further improving etching performance. The additive may include a surfactant, a metal ion sequestrant, a corrosion inhibitor, or the like.

The etchant composition of the present disclosure is used for selectively removing a nitride film by etching from a semiconductor device including an oxide film and a nitride film, and the nitride film may include a silicon nitride film, for example, a SiN film, a SiON film, or the like.

In addition, the oxide film may be at least one film selected from the group consisting of a silicon oxide film, for example, a spin on dielectric (SOD) film, a high density plasma (HDP) film, a thermal oxide film, a borophosphate silicate glass (BPSG) film, a phosphosilicate glass (PSG) film, a borosilicate glass (BSG) film, a polysilazane (PSZ) film, a fluorinated silicate glass (FSG) film, a low pressure tetraethyl orthosilicate (LPTEOS) film, a plasma enhanced tetraethyl orthosilicate (PETEOS) film, a high temperature oxide (HTO) film, a medium temperature oxide (MTO) film, an undopped silicate glass (USG) film, a spin on glass (SOG) film, an advanced planarization layer (APL) film, an atomic layer deposition (ALD) film, a plasma enhanced oxide (Pe-oxide) film, an O3-tetraethyl orthosilicate (O3-TEOS) film, or combinations thereof.

An etching process using the etchant composition of the present disclosure may be performed by a wet etching method well-known in the art, for example, dipping, spraying, or the like.

Figure 2:
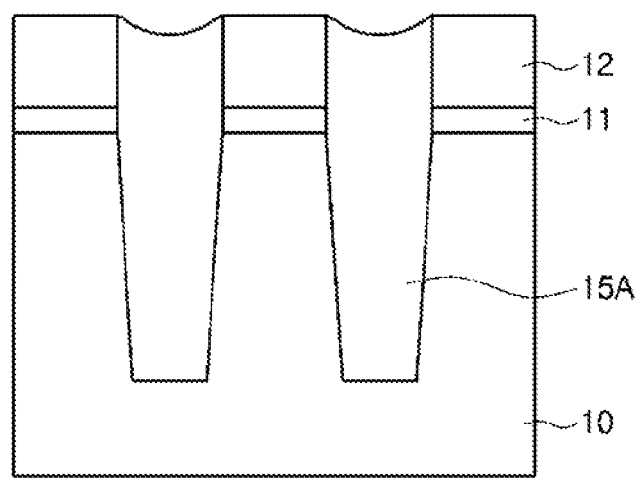

FIGS. 1 and 2 are process sectional views showing a device separation process of a flash memory device.

First, as shown in FIG. 1, a tunnel oxide film 11, a polysilicon film 12, a buffer oxide film 13, and a pad nitride film 14 are formed in turn on a substrate 10, and then the polysilicon film 12, the buffer oxide film 13, and the pad nitride film 14 are selectively etched to form a trench. Subsequently, an SOD oxide film 15 is formed until the trench is gap-filled, and then a CMP process is carried out on the SOD oxide film 15 using the pad nitride film 14 as a polishing stop film.

Next, as shown in FIG. 2, the pad nitride film 14 is removed by wet etching using a phosphoric acid solution, and then the buffer oxide film 13 is removed by a washing process. As a result, a device separation film 15A is formed in a field area.

During the etching process, a process temperature may be in a range of 50 to 300° C., preferably 100 to 200° C., more preferably 156 to 163° C., and an appropriate temperature may be changed as required considering other processes and other factors.

As such, according to a manufacturing method of a semiconductor device including the etching process which is carried out using the etchant composition of the present disclosure, when the nitride film and the oxide film is alternately stacked or mixed, it is possible to selectively etch the nitride film. In addition, particle occurrence which was problematic in the conventional etching process may be prevented to secure stability and reliability.

Accordingly, the method may be efficiently applied various processes requiring selective etching of the nitride film to the oxide film in the semiconductor device manufacturing process.

EXAMPLE

Hereinafter, the present disclosure will be described in detail by way or examples. The following Examples relate to example of the present disclosure, but the present disclosure is not limited thereto.

Synthesis Example 1

Silane Compound A 14.9 g of triethanolamine and 23.4 ml of aminopropyl triethoxysilane were added to a 100 ml round-bottom flask, heated to 130° C. and stirred for 2 hours.

Thereafter, the reactants were further stirred for 2 hours while removing ethanol under a condition of reduced pressure, cooled to normal temperature, and distilled under reduced pressure to synthesize 21.9 g of purified Silane Compound A [3-(2,8,9-trioxa-5-aza-1-silabicyclo[3.3.3]undecan-1-yl)propane-1-amine] represented by the following formula:

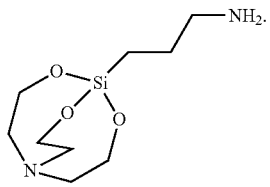 [SMILES: NCCC[Si]12OCCN(CCO1)CCO2]

$^1$H-NMR (CDCl$_3$) 3.66 (t, J=5.5 Hz, 6H), 2.71 (t, J=5.5 Hz, 6H), 2.52 (t, J=7.0 Hz, 2H), 1.42 (qui, J=9.0 Hz, 2H), 1.19 (br, 2H), 2.00 (t, J=8.5 Hz, 2H)

Synthesis Example 2

Silane Compound B 14.9 g of triethanolamine and 20.0 ml of methyltriethoxysilane were added to a 100 ml round-bottom flask, heated to 130° C. and stirred for 2 hours.

Thereafter, the reactants were further stirred for 2 hours while removing ethanol under a condition of reduced pressure, cooled to normal temperature, and re-slurried with toluene to synthesize 14.4 g of purified Silane Compound B [1-methyl-2,8,9-trioxa-5-aza-1-silabicyclo[3.3.3]undecane] represented by the following formula:

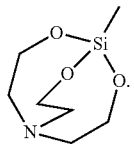

$^1$H-NMR (CDCl$_3$) 3.68 (t, J=5.5 Hz, 6H), 2.73 (t, J=5.5 Hz, 6H), −0.21 (s, 3H)

Synthesis Example 3

Silane Compound C 14.9 g of triethanolamine, 9.7 ml of 1-[3-(trimethoxysilyl)propyl]urea, and 20.0 ml of toluene were added to a 100 ml round-bottom flask, heated to 110° C. an stirred for 2 hours.

Thereafter, the reactants were further stirred for 2 hours while removing methanol under a condition of reduced pressure, and cooled to normal temperature. At this time, it was confirmed that a white solid was produced.

The solid was filtered, washed with toluene, and vacuum-dried to synthesize 2.4 g of Silane Compound C [1-(3-(2,8,9-trioxa-5-aza-1-silabicyclo[3.3.3]undecan-1-yl) propyl) urea] represented by the following formula:

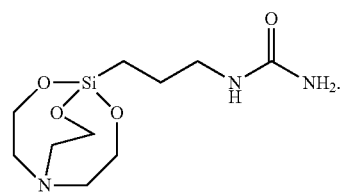 [SMILES: NC(=O)NCCC[Si]12OCCN(CCO1)CCO2]

$^1$H-NMR (CDCl$_3$) 3.69 (t, J=5.5 Hz, 6H), 3.39 (t, J=7.0 Hz, 2H), 2.73. (t, J=5.5 Hz, 6H), 1.47 (qui, J=9.0 Hz, 2H), 2.03 (t, J=8.5 Hz, 2H)

Synthesis Example 4

Silane Compound D 9.5 g of triethanolamine, 12.5 g of trimethoxyphenylsilane, and 50 ml of toluene were added to a 100 ml round-bottom flask, heated to 110° C. and stirred for 2 hours.

Thereafter, the reactants were further stirred for 2 hours while removing methanol under a condition of reduced pressure, and cooled to normal temperature. At this time, it was confirmed that a white solid was produced.

The solid was filtered, washed with toluene, and vacuum-dried to synthesize 12 g of Silane Compound D [1-phenyl-2,8,9-trioxa-5-aza-1-silabicyclo[3.3.3]undecane] represented by the following formula:

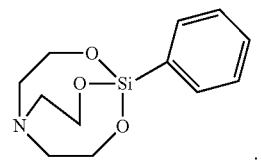 [SMILES: c1ccc([Si]23OCCN(CCO2)CCO3)cc1]

$^1$H-NMR (CDCl$_3$) 7.79-7.77 (m, 1H) 7.32-7.20 (m, 4H), 3.9 (m, 2H), 2.39 (m, 2H)

Synthesis Example 5

Silane Compound E 15.0 of triethanolamine, 117.1 g of bis[3-(trimethoxysilyl)propyl]amine, 50 ml of toluene, and 0.01 g or potassium hydroxide were added to a 100 ml round-bottom flask, heated to 120° C. and stirred for 2 hours.

Thereafter the reactants were further stirred for 2 hours while removing methanol under a condition of reduced pressure, and cooled to normal temperature. At this time, it was confirmed that a white solid was produced.

The solid was filtered, washed with toluene, and vacuum-dried to synthesize 21 g of Silane Compound E [bis(3-(2,8,9-trioxa-5-aza-1-silabicyclo[3.3.3]undecan-1-yl)propyl) amine] represented by the following formula:

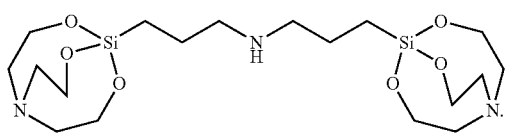 [SMILES: C(CNCCC[Si]12OCCN(CCO1)CCO2)C[Si]12OCCN(CCO1)CCO2]

¹H-NMR (CDCl₃) 3.75 (t, J=5.5 Hz, 12H), 2.79 (t, J=5.5 Hz, 12H), 2.62 (t, J=7.0 Hz, 4H), 1.61 (qui, J=9.0 Hz, 4H), 0.40 (m, 4H)

Synthesis Example 6

Silane Compound F 5.9 g of triethanolamine, 5.3 g of bis(trimethoxysilyl)ethane, 50 ml of toluene, and 0.01 g of potassium hydroxide were added to a 100 ml round-bottom flask, heated to 120° C. and stirred for 2 hours.

Thereafter, the reactants were further stirred for 2 hours while removing methanol under a condition of reduced pressure, and cooled to normal temperature. At this time, it was confirmed that a white solid was produced.

The solid was filtered, washed with toluene, and vacuum-dried to synthesize 14 g of Silane Compound F [1,2-di(2,8,9-trioxa-5-aza-1-silabicyclo[3.3.3]undecan-1-yl) ethane] represented by the following formula:

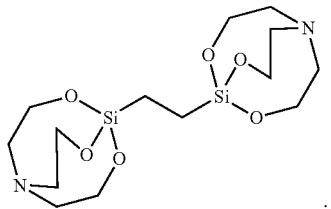 [SMILES: C1CN2CCO[Si](CC[Si]34OCCN(CCO3)CCO4)(O1)OCC2]

¹H-NMR (CDCl₃) 3.73 (t, J=5.5 Hz, 12H), 2.73 (t, J=5.5 Hz, 12H), 0.52 (s, 4H)

Synthesis Example 7

Silane Compound G 19.7 g of 1-[bis(2-hydroxyethyl)amino]-3-chloro-2-propanol, 15 g ethyltrimethoxysilane, 50 ml of toluene, 0.01 g of potassium hydroxide were added to a 100 ml round-bottom flask, heated to 120° C. and stirred for 2 hours.

Thereafter, the reactants were further stirred for 2 hours while removing methanol under a condition of reduced pressure, and cooled to normal temperature. At this time, it was confirmed that a white solid was produced.

The solid was filtered, washed with toluene, and vacuum-dried to synthesize 7 g of Silane Compound G [3-(chloromethyl)-1-ethyl-2,8,9-trioxa-5-aza-1-silabicyclo[3.3.3]undecan] represented by the following formula:

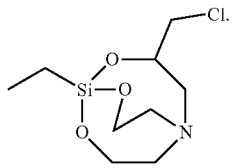

¹H-NMR (CDCl₃) 4.53 (m, 1H), 3.73 (t, J=5.5 Hz, 4H), 3.38 (m, 2H), 3.02 (m, 2H), 2.73 (t, J=5.5 Hz, 4H), 1.40 (q, J=9.0 Hz, 2H), 0.90 (t, J=9.0 Hz 3H)

Synthesis Example 8

Silane Compound H 21.7 g of 3-[bis(2-hydroxyethyl)amino]1,1,1-trifluoro-2-propanol, 13.6 g of methyltrimethoxysilane, 50 ml of toluene, 0.01 g of potassium hydroxide were added to a 100 ml round-bottom flash heated to 120° C. stirred for 2 hours.

Thereafter, the reactants were further stirred for 2 hours while removing methanol under a condition of reduced pressure, and cooled to normal temperature. At this time, it was confirmed that a white solid was produced.

The solid as filtered, washed with toluene, and vacuum-dried to synthesize 11 g of Silane Compound H [1-methyl 3-(trifluoromethyl)-2,8,9-trioxa-5-aza-1-silabicyclo[3,3.3] undecane] represented by the following formula:

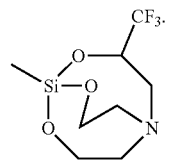

¹H-NMR (CDCl₃) 6.32 (m, 1H), 3.73 (t, J=5.5 Hz, 4H), 3.07 (d, J=6.0 Hz, 2H), 2.73 (t, J=5.5 Hz, 4H), 0.67 (s, 3H)

Synthesis Example 9

Silane Compound I 22.5 g of a-[[bis(2-hydroxyethyl)amino]methyl]benzenemethanol, 15 g of ethyltrimethoxysilane 50 ml of toluene, 0.01 g of potassium hydroxide were added to a 100 ml round-bottom flask, heated to 120° C. and stirred for 2 hours.

Thereafter, the reactants were further stirred for 2 hours while removing methanol under a condition of reduced pressure, and cooled to normal temperature. At this time, it was confirmed that a white solid was produced.

The solid was filtered, washed with toluene, and vacuum-dried to synthesize 5 g of Silane Compound I [1-ethyl-3-phenyl-2,8,9-trioxa-5-aza-1-silabicyclo[3,3.3]undecane] represented the following formula:

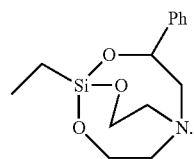

¹H-NMR (CDCl₃) 7.32 (m, 2H), 7.25 (m, 3H), 5.50 (m, 1H), 3.74 (t, J=5.5 Hz, 4H), 2.95 (m, 2H), 2.77 (t, J=5.5 Hz, 4H), 1.43 (q, J=9.0 Hz, 2H), 0.85 (t, J=9.0 Hz, 3H)

Synthesis Example 10

Silane Compound J 2.0 g of 1-ethenyl-2,8,9-trioxa-5-aza-1-silabicyclo[3,3,3]-undecane, 6.5 g of potassium cyanide, 20 ml of DMF, and 20 ml of acetonitrile were added to a 100 ml round-bottom flask, and stirred at normal temperature for 24 hours.

Thereafter, the solvent was all removed under a condition of reduced pressure. At this time, it was confirmed that a white solid was produced.

The solid was re-slurried with 20 ml of toluene, filtered, and vacuum-dried to synthesize 1.5 g Silane Compound [1-ethenyl-2,8,9-trioxa-5-aza-1-silabicyclo[3,3,3]undecane-4-carbonitrile] represented by the following formula:

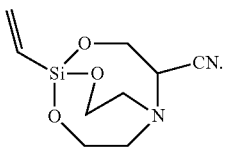

$^1$H-NMR (CDCl$_3$) 5.45 (d, J=7.5 Hz 1H), 5.30 (d, J=7.5 Hz, 1H), 5.09 (d, J=7.5 Hz, 1H), 4.42 (d, J=5.5 Hz, 2H), 3.78 (t, J=5.5 Hz, 4H), 3.07 (m, 1H), 2.73 (t, J=5.5 Hz, 4H)

Synthesis Example 11

Silane Compound K 19.3 g of N,N-bis(2-hydroxyethyl)-L-serine, 13.6 g of methyltrimethoxysilane, and 50 ml of toluene were added to a 100 ml round-bottom heated flask, heated to 120° C. and stirred for 48 hours.

Thereafter, the reactants were further stirred for 12 hours while removing methanol under a condition of reduced pressure, and cooled to normal temperature. At this time, it was confirmed that a white solid was produced.

The solid was filtered, washed with toluene, and vacuum-dried to synthesize 10 g of Silane Compound K [1-methyl-2,8,9-trioxa-5-aza-1-silabicyclo[3,3,3]undecane-4-carboxylic acid] represented by the following formula:

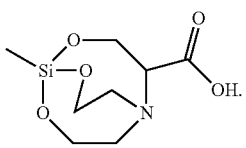

$^1$H-NMR (CDCl$_3$) 12.22 (br, 1H), 4.35 (d, J=5.5 Hz, 2H), 3.74 (t, J=5.5 Hz, 4H), 2.99 (m, 1H), 2.73 (t, J=5.5 Hz, 4H), 0.65 (s, 3H)

Examples 1 to 11 and Comparative Example 1

Each of Silane Compounds A to K obtained in Synthesis Examples 1 to 11 was added to 85% phosphoric acid and mixed therewith so that the content was 100 wt % as shown in Table 1, thereby preparing etchant solutions (Examples 1 to 11).

As Comparative Example 1, 0.5 wt % of 3-aminopropylsilanetriol (Comparative Silane Compound 1) was added to 99.5 wt % of 85% phosphoric acid and mixed therewith, thereby preparing an etchant (Comparative Example 1), as shown in Table 1.

A substrate in which a silicon oxide (SiOx) film deposited at a thickness of 500 angstroms (Å) and a silicon nitride (SiN) film deposited at a thickness of 5000 Å were formed on a semiconductor wafer was prepared, and the substrate was etched with the etching solutions of Examples 1 to 11 and Comparative Example 1, when a temperature of 156° C. or 163° C. was reached.

The wet etching composition was added to a round flask, heated for 60 minutes, and when dipping was performed in the above range, the silicon wafer was dipped in the etchant composition for 720 seconds and 6000 seconds, respectively.

A surface of the silicon wafer on which a pattern was formed was selectively etched, and film thicknesses of the silicon oxide film and the silicon nitride film before and after etching were measured using thin film thickness measurement equipment (NANO VIEW, SEMG-1000).

The selection ratio represents a ratio of a nitride film etching speed (SiN E/R) to an oxide film etching (SiO E/R), and is a value calculated by dividing a difference in film thicknesses before and after etching by an etching time (minute).

Example 12

Silane Compound E obtained in Synthesis Example 5 added to 85% phosphoric acid and mixed therewith so that the content was 100 wt % as shown in Table 1, thereby preparing an etchant solution (Example 12).

The etchant solution of Example 12 was used to etch the silicon nitride film and the silicon oxide film in the same manner as in Example 1 on the same substrate as Example 1.

A selection ratio was measured in the same manner as in Example 1, and the results are shown in Table 1.

TABLE 1

|  | Composition | Process temperature (° C.) | SiN E/R (Å/min) | SiO E/R (Å/min) | Selection ratio |
|---|---|---|---|---|---|
| Comparative Example 1 | Phosphoric acid (99.5 wt %) + Comparative Silane Compound (0.5 wt %) | 158 | 68.3 | 0.32 | 213 |
| Example 1 | Phosphoric acid (99.5 wt %) + Silane Compound A (0.5 wt %) | 158 | 81.3 | 0.25 | 365 |
| Example 2 | Phosphoric acid (99.5 wt %) + Silane Compound B (0.5 wt %) | 158 | 85.6 | 0.13 | 658 |
| Example 3 | Phosphoric acid (99.5 wt %) + Silane Compound C (0.5 wt %) | 158 | 82.7 | 0.27 | 306 |
| Example 4 | Phosphoric acid (99.5 wt-%) + Silane Compound D (0.5 wt. %) | 158 | 80.5 | 0.22 | 366 |
| Example 5 | Phosphoric acid (99.5 wt %) + Silane Compound E (0.5 wt %) | 158 | 91.3 | 0.07 | 1304 |

TABLE 1-continued

| | Composition | Process temperature (° C.) | SiN E/R (Å/min) | SiO E/R (Å/min) | Selection ratio |
|---|---|---|---|---|---|
| Example 6 | Phosphoric acid (99.5 wt %) + Silane Compound F (0.5 wt %) | 158 | 90.7 | 0.11 | 824 |
| Example 7 | Phosphoric acid (99.5 wt %) + Silane Compound G (0.5 wt %) | 158 | 94.4 | 0.04 | 2360 |
| Example 8 | Phosphoric acid (99.5 wt %) + Silane Compound H 0.5 (wt. %) | 158 | 92.8 | 0.06 | 1547 |
| Example 9 | Phosphoric acid (99.5 wt %) + Silane Compound I (0.5 wt %) | 158 | 83.5 | 0.21 | 398 |
| Example 10 | Phosphoric acid (99.5 wt %) + Silane Compound J (0.5 wt %) | 158 | 89.7 | 0.12 | 748 |
| Example 11 | Phosphoric acid (99.5 wt %) + Silane Compound K (0.5 wt %) | 158 | 83.1 | 0.24 | 346 |
| Example 12 | Phosphoric acid (99.998 wt %) + Silane Compound E (0.002 wt %) | 158 | 80.2 | 0.18 | 446 |

As shown in Table 1 above, it is recognized that in Examples 1 to 12, a cyclic silane compound which may be present in a stable form in the etchant composition is included to improve structural stability of the active silicon-based additive, thereby significantly increasing an etch selection ratio, as compared with Comparative Example 1 including a silane compound having a short chain structure. Thus, the etching speed of the silicon oxide film may be consistently improved.

The etchant composition according to the present disclosure has a high etching selection ratio of a nitride film to an oxide film, by including a silane compound which is reacted with a surface of an oxide film to form a protective film capable of protecting the oxide film.

In addition, use of the etchant composition of the present disclosure prevents damage of film quality of the oxide film when removing the nitride film or deterioration of electrical properties due to etching of the oxide film, thereby improving device characteristics.

In particular, the present disclosure uses the silane compound having a silatrane structure to maintain a stable structure in the etchant solution, thereby obtaining an excellent selection ratio even with the addition of a small amount.

While exemplary embodiments have been shown and described above, it will be apparent to the skilled in the art that modifications and variations could be made without departing from the scope of the present invention as defined by the appended claims.

What is claimed is:

1. A silane compound represented by the following Chemical Formula 1:

[Chemical Formula 1]

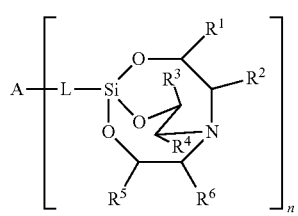

wherein $R^1$ to $R^6$ are independently hydrogen, halogen, a substituted or unsubstituted $C_1$-$C_{20}$ hydrocarbyl group, a phenyl group, a $C_1$-$C_{20}$ alkoxy group, a carboxy group, a carbonyl group, a nitro group, a tri ($C_1$-$C_{20}$) alkylsilyl group, a phosphoryl group, or a cyano group, L is a direct bond or $C_1$-$C_3$ alkylene, n is 4, A is

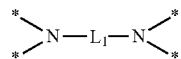

as a tetravalent radical, and $L_1$ is $C_1$-$C_{10}$ alkylene.

2. The silane compound of claim 1, wherein Chemical Formula 1 is represented by the following structure:

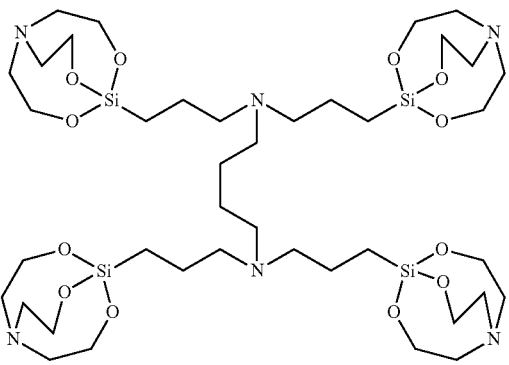

* * * * *